United States Patent [19]
Karczmar et al.

[11] Patent Number: 6,037,772
[45] Date of Patent: Mar. 14, 2000

[54] FAST SPECTROSCOPIC IMAGING SYSTEM

[75] Inventors: Gregory S. Karczmar, Crete; David A. Kovar, Chicago, both of Ill.

[73] Assignee: Arch Development Corp., Chicago, Ill.

[21] Appl. No.: 09/003,250

[22] Filed: Jan. 6, 1998

[51] Int. Cl.[7] .................................................. G01V 3/00
[52] U.S. Cl. ........................... 324/309; 324/318; 600/410
[58] Field of Search ..................................... 324/309, 318, 324/322, 313, 312; 600/410

[56] References Cited

U.S. PATENT DOCUMENTS 5,479,924  1/1996  Navon et al. ......................... 128/653.2

OTHER PUBLICATIONS

Doyle, M., et al, Chemical–Shift Imaging: A Hybrid Approach, 5 Magnetic Resonance in Medicine 255–261 (1987).

Guilfoyle, D.N., et al., Chemical–Shift Imaging, 2 Magnetic Resonance in Medicine 479–489 (1985).

Mansfield, P., Spatial Mapping of the Chemical Shift in NMR, 1 Magnetic Resonance in Medicine 370–386 (1984).

Williams, S., et al. True Water and Fat MR Imaging with Use of Multiple –Echo Acquisition, 173:1 Medical Physics 249–253 (Oct., 1989).

*Primary Examiner*—Christine K. Oda
*Assistant Examiner*—Brij B. Shrivastav
*Attorney, Agent, or Firm*—Welsh & Katz, Ltd.

[57] ABSTRACT

An apparatus and method are provided for generating a magnetic resonance image of a biotic structure. The method includes the steps of generating a plurality of datasets by modulating a free induction decay of at least some MR detectable nuclei in the biotic structure with a sinusoidally oscillating magnetic field gradient and using the spectroscopic and spatial information present in the acquired signal to approximate a set of instantaneously acquired gradient echoes. The method further includes the step of synthesizing images based upon the approximated acquired gradient echoes.

32 Claims, 7 Drawing Sheets

INTEGRAL

PEAK

SPIN ECHO

GRADIENT ECHO

GRADIENT ECHO

FAT PEAK

WATER PEAK

FAST SPECTROSCOPIC IMAGING SYSTEM

The U.S. Government has a paid-up license in this invention and the right in limited circumstances to require the patent owner to license others on reasonable terms as provided for by the terms of Contract Number NIH #1413601-97-0030 or CA52008 awarded by the National Institute of Health.

FIELD OF THE INVENTION

The field of the invention relates to magnetic resonance imaging and more particularly to the use of spectroscopic imaging methods (and more particularly, fast spectroscopic imaging methods) to obtain very accurate anatomic images which have high signal-to-noise ratio.

BACKGROUND OF THE INVENTION

Magnetic resonance imaging (MRI) using nuclear magnetic resonance (NMR) are known. Under NMR and MRI, a magnetic field is applied to a sample (e.g., tissue). In response, the magnetic moments of the nuclei of certain molecular components of the sample (e.g., a proton of a water molecule) may align themselves with the magnetic field. Protons of water molecules will be used as an example in the following, since this is the signal used for conventional clinical magnetic resonance imaging.

Once aligned with the magnetic field, a radio frequency may be applied to the proton magnetic moment which perturbs the moment away from its equilibrium state. The magnetic moment then begins to induce a current in a detector coil tuned to the resonance frequency. This process is referred to as free induction decay (FID).

The frequency at which a given magnetic moment will resonate is a function (among other things) of the type of molecular component involved, its chemical bonds, the molecular environment and the magnetic field applied to the component. The resonance frequency is typically referred to as the Larmor frequency.

Where a magnetic field varies across a sample, a proton at one location has a different Larmor frequency than at another location. In knowing a magnetic field gradient across a sample, a Larmor frequency can be calculated at each position. In knowing the Larmor frequency at each position, an excitation frequency may be selected which will excite protons and produce signal at only one specific location. Using a variety of frequencies corresponding to different protons across a magnetic field, a magnetic resonance signal may be detected from protons in each one of a number of slices. Additional gradients are applied to obtain two dimensional images of each slice, based on the amount of signal detected at each resonance frequency within the excited slice.

One difficulty producing images based on applied magnetic field gradients is that the applied gradients are not the only fields which control the Larmor frequency. For example, the frequency of the proton FID may vary due to a number of factors (e.g., chemical environment, interactions with surrounding protons and other magnetic moments, and local magnetic susceptibility gradients, etc.). These effects, which are typically referred to as resonance offset effects cause distortions in magnetic resonance images, which can only be corrected if the resonance offset effects are directly measured.

Conventional magnetic resonance imaging procedures typically do not detect the entire proton spectrum of the FID in each three-dimensional space (voxel) and as a result, the resonance offset effects referred to above are not measured. This lack of spectral information has several drawbacks:

First, the incomplete spectral information results in a loss of anatomical information due to artifacts related to resonance offset effects.

Second, due to the incomplete capture of spectral information, the information contained in the line shape and resonance frequency of fat and water is lost. If this information could be captured, it could be used to improve image contrast, and might be clinically useful.

Third, conventional MR imaging relies primarily on $T_1$ and $T_2$ relaxation to provide image contrast. While, $T_2^*$ contrast might have great clinic utility, it is not practical to obtain strongly $T_2^*$ weighted contrast (i.e., using gradient echo images). For example because of the lack of spectral information, $T_2^*$ contrast is typically accompanied by severe artifacts due to resonance offset effects, even when spatial resolution is very high.

Previous efforts to improve the performance of MRI have incorporated low resolution spectroscopic information into MR imaging solutions, using methods suggested by W. T. Dixon, and their variants. These approaches have met with some success in improving image quality. These previous efforts rely on incomplete spectra of water and fat, however, and therefore do to take full advantage of FID spectral information. Accordingly, a need exists for an MRI system that takes full advantage of spectral information that may be acquired from fat and water molecules. This can be done using spectroscopic imaging methods based on those proposed by Maudsley et al. and Brown et al. However, in practice, image acquisition with these methods is too slow for most clinical examinations. Therefore, this invention discusses the use of fast spectroscopic imaging methods similar to those proposed by Mansfield et al. To obtain high resolution spectral and spatial information. FSI methods make it practical to acquire spectroscopic image data in a short amount of time, i.e., within the time allotted for a normal clinical exam.

SUMMARY

An apparatus and method are provided for generating a magnetic resonance image of a biotic structure. The method includes the steps of generating a plurality of datasets by modulating a free induction decay of at least some MR detectable nuclei in the biotic structure with a sinusoidally oscillating magnetic field gradient and using the spectroscopic and spatial information present in the acquired signal to approximate a set of gradient echoes acquired instantaneously and a series of sampling points during the proton free induction decay. This series of gradient echoes is analyzed to obtain a magnetic resonance spectrum associated with each of a large number of voxels in the imaged object. The method further includes the step of synthesizing images based upon the approximated gradient echoes. In these synthesized images, image intensity can be based on the peak integrals, peak heights, linewidths, resonance frequencies, and/or various other features of the lineshapes of each resonance which is resolved in the spectrum.

DETAILED DESCRIPTION OF A PREFERRED EMBODIMENT

Figure 1:
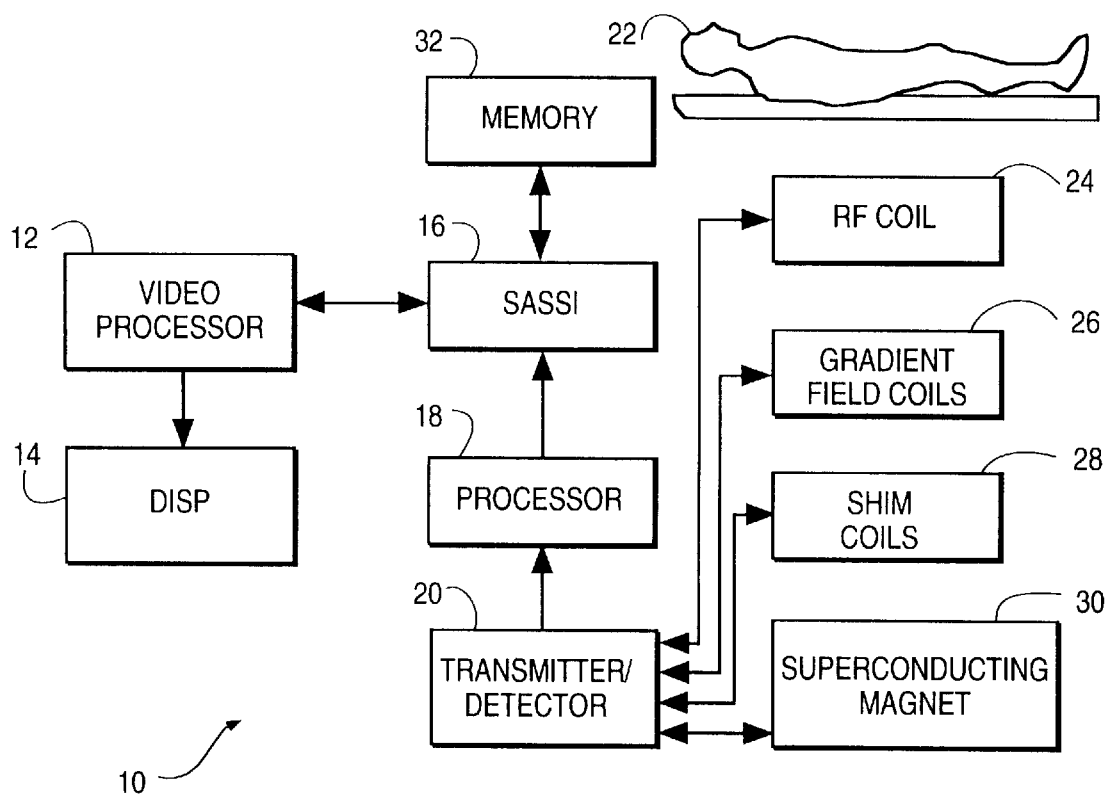
FIG. 1 depicts a block diagram of a magnetic resonance imaging system in accordance with an embodiment of the invention.
Figure 2A:
FIG. 2 an excitation sequence of the system of FIG. 1.
Figure 2B:
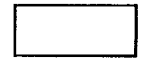
Figure 2C:
Figure 2D:
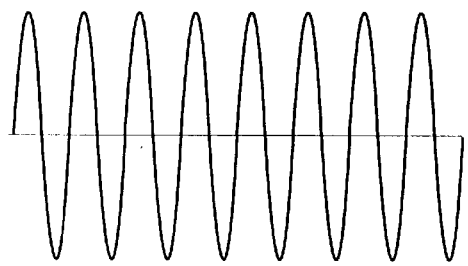

FIG. 1 is a block diagram of an MR imaging system 10, generally in accordance with an illustrated embodiment of the invention. The MR imaging system 10 functions to generate images by operating on MR detectable nuclei (e.g., a hydrogen proton) with a combination of static and radio frequency magnetic fields applied through a superconducting magnet 30 and an appropriate set of coils 24, 26, 28. Radiofrequency energy applied at the Larmor frequency perturbs the nuclear magnetic moments away from their equilibrium state, and this results in the release of energy during free induction decay (FID).

Prior art methods using fast Spectroscopic Imaging (FSI) have been described (e.g., *Spatial Mapping of the Chemical Shift in NMR*; Manfield, P., Magnetic Resonance in Medicine, 1984, Vol. 1,p. 370–386: *Chemical Shift Imaging: a Hybrid Approach*; Doyle, M. and Mansfield, P.; Magnetic Resonance in Medicine, 1987, Vol. 5, p. 255–261, etc.). The originators of FSI proposed it as a method for imaging metabolites rather than as a means to obtain anatomic images of superior quality. To date FSI has been used for low resolution imaging of metabolites such as creatine which are present at low concentrations (1 mM–10 mM). Under an illustrated embodiment, a new application of FSI—the use of FSI to produce anatomic images with high spectral and spatial resolution from water and fat signals is described and demonstrated. FSI has the potential to bring advantages to clinical water and fat imaging with an improved acquisition time.

Some advantages of FSI include
1) the potential to obtain $T_2^*$ contrast which is very similar to $T_2$ contrast under conditions which maximize signal-to-noise ratio (i.e., no requirement for RF refocusing, low tip angle, and short TR),
2) simultaneous acquisition of $T_2^*$ and $T_1$ weighted images, and optimal signal-to-noise ratio per unit time.
3) $T_2^*$ contrast provided by spectroscopic imaging/FSI may in many cases be superior to $T_2$ contrast (see our results below) but cannot be obtained without severe artifacts using conventional MRI methods.
4) a single FSI dataset can be used to synthesize a variety of images with improved contrast, which is dependent on details of the water and fat signal lineshapes (of derivation of resonance frequency and line shape).
5) One of the most important advantages of FSI is the use of spectroscopic data to obtain -optimal separation of spatial and spectral information (we refer to this method as SASSI) and thus to obtain water and fat proton images in which distortions due to resonance offset effects are minimized.

While the test may be performed on a human subject, the methods and apparatus 10 may be used to create images of any biotic structure 22. For instance, fast spectroscopic images of F344 rodents with mammary tumors were acquired using a 4.7 Tesla Omega MR scanner (GE/Bruker, Fremont) equipped with Accustar™ self-shielded gradient coils. Images were also acquired from a human breast on a Signa MR scanner, manufactured by GE. In order to optimally utilize the FSI data, regridding schemes which optimally separate spatial and spectral information were developed as described below. Separation of spatial and spectral information (SASSI) is accomplished by calculating the effects of resonance offset and relaxation on the signal at each point in k-space and correcting signal amplitude and phase for these effects. The resulting data set is then used to synthesize images in which spatial and spectral information are relatively independent.

Separation of spectral and spatial information minimizes resonance offset effects. As a result, artifacts are reduced and the resulting images are qualitatively improved. An additional benefit of SASSI is that data from odd and even gradient echoes (i.e., the zeroth, second, fourth etc gradient echo in the echo train are the even echoes) can be combined without introducing artifacts—thus increasing the effective spectral bandwidth of FSI by a factor of two.

The results reported following demonstrate that use of fast spectroscopic imaging to obtain water and fat images with high spatial and frequency resolution, significantly improves the quality of anatomic images. Use of FSI as a substitute for conventional MRI represents a significant departure from standard clinical practice. In fact, Fast Spectroscopic Imaging of water and fat protons with high spatial and spectral resolution may often be preferable to conventional MRI. Fast spectroscopic imaging may provide superior anatomical definition compared to conventional MRI. In addition, FSI may allow more accurate measurement of the kinetics of contrast media uptake compared to conventional MRI. One advantage of FSI relative to conventional MRI which is examined in detail is the use of spectral data to reduce image distortion and artifacts due to resonance offset effects.

The raw FID data used for image generation may be generated using any of a number of techniques (e.g., Fast Spectroscopic imaging (FSI) methods developed by Mansfield and Doyle, as set forth above, or the conventional phase encoding method described by both Maudsley et al. (Maudsley, A. A., Hilal S. K., Perman, W. H. and Simon, H. E. *Spatially Resolved High Resolution Spectroscopy By "Four-Dimensional NMR"*, Journal Of Magnetic Resonance 1983; 51: 147–152.) and Brown et al. (Brown, T. M., Kincaid, B. M. and Ugurbil, K., *NMR Chemical Shift Imaging In The Three Dimensions*, Procedures Of The National Academy Of Sciences 1982; 79: 3523–3526)). The FSI method set forth in this description may include the application of a sinusoidally-oscillating readout gradient following slice selective excitation and phase encoding (see FIG. 2). This produces a series of gradient echo images in which the phase and amplitude of the signal in each pixel is modulated by the resonance frequency and relaxation of the various Fourier components of the proton spectrum. FSI provides a proton spectrum (primarily containing water and fat signals) associated with each image voxel. The information contained in the spectral dimension can be analyzed to synthesize images which may have a number of advantages to conventional MRI.

In tissues such as breast where large water and fat resonances are present, FSI provides an improved separation of water and fat resonances compared to the traditional methods such as those described by Dixon (i.e., *Simple Proton Spectroscopic Imaging*; Dixon, W. T.; 1984, Radiology, Vol. 153, p. 189–194). Further, FSI may provide "$T_2$-like" contrast without the need for spin echoes. The results suggest that the $T_2^*$ contrast provided by FSI datasets (by measurement of line width or peak height) can approximate $T_2$ contrast. To the extent that high resolution spectroscopic data resolve individual homogeneously broadened resonances, $T_2$ can approach $T_2$. Because of the heterogeneity of living tissue, it is unlikely that the limit $T_2^*=T_2$ can be reached except in edematous areas. The $T_2$ contrast which has been obtained in FSI datasets from rodent tumors is similar to but more heterogeneous than $T_2$ contrast, and is obtained under conditions (short TR and low pulse angle) which maximize signal-to-noise ratio and avoid artifacts due to imperfect RF-refocusing pulses. In fact, preliminary data suggest that $T_2^*$ contrast may often be preferable to the conventional $T_2$ contrast. The contrast-to-noise ratio of $T_2^*$ weighted images appears to be significantly greater than that of $T_2$ weighted images and the representation of anatomic details such as tumor boundaries appears to be much improved (see data discussed below). This might be expected, because spin echoes which yield $T_2$ contrast suppress many of the effects which contribute to $T_2^*$ contrast. In conventional images this is highly desirable because $T_2^*$ effects lead to phase and amplitude distortions which make images very difficult to interpret. However, when relatively high resolution spectroscopic data are available and the data analysis methods described here are used, the distortions caused by $T_2^*$ effects can be minimized, while the desirable contrast due to $T_2^*$ can be preserved.

FSI also optimizes signal-to-noise ratio per unit time. In conventional MR spectroscopy it is well known that signal-to-noise ratio is maximized by detection of the proton FID up to the point where the FID has decayed to less than ~70% of its initial intensity. Conventional MRI detects only a small portion of the proton FID and discards signal which could be used to optimize signal-to-noise ratio. FSI makes it possible to image with the highest possible signal-to-noise ratio per unit time by optimizing the portion of the proton FID which is detected in each voxel.

FSI provides new sources of contrast. The extra dimension of data, i.e., the frequency dimension, which is acquired with FSI greatly increases the size of the parameter space which describes the image. It is likely that appropriate analysis of this large quantity of information will produce clinically useful contrast which has not previously been available. Information which can be obtained from FSI datasets, and which is not available from conventional MRI include the peak heights and integrals of individual resonances, resonance frequencies, ratios of various Fourier components (for example fat/water), and parameters which describe the detailed line shapes of various resonances (including accurate measurements of $T_2^*$). Previous spectroscopic imaging studies of rodent tumors performed in this laboratory (Oikawa, H., Al-Hallaq, H., Lewis, M. Z., River, J. N., Kovar, D. A. and Karczmar, G. S., *Spectroscopic Imaging Of The Water Resonance With Short Repetition Time To Study Tumor Response To Hyperoxia*, Magnetic Resonance In Medicine 1997; 38: 27–33.) demonstrate that there is significant heterogeneity in water and fat resonances of small pixels in tumors, and that changes in the "fine structure" of these resonances under various conditions contain valuable information.

FSI reduces resonance offset effects. Conventional MR images contain artifacts and blurring due to resonance offset effects. That is, the apparent shape and intensity of image features are significantly affected by the resonance frequencies of the different spectral components which contribute to the signal. Previous methods have used limited spectroscopic information obtained with "Dixon-type" methods to correct images for resonance offset effects. The use of the more detailed spectral information which is available with FSI to obtain more accurate and realizable correction for resonance offset effects is described here.

R3230 mammary adenocarcinomas subcutaneously implanted in the hind limbs of Fisher F344 female rats (n=8) were used as imaging subjects. Animals were anesthetized by continuous I.P. administration of ketamine (5 mg/100 gm per hr) and xylazine (01. mg/100 gm per hr).

Images of rodent tumors were obtained using a 4.7 Tesla Omega MR scanner (GE/Bruker, Fremont) equipped with Accustar™ self-shielded gradient coils. Following excitation of signal in a single 2 mm thick slice, the resulting proton free induction decay (FID) was acquired in the presence of a readout gradient with sinusoidally varying amplitude. The sinusoid was composed of 16, 3 msec cycles with a maximum amplitude of 2 gauss/cm. This produced an FID composed of 32 gradient echoes, approximately 1.5 msec apart. Sinusoidal gradients were selected to minimize eddy currents. Each FID was sampled for a total acquisition time of 48 msec; 128 points were collected for each gradient echo. An initial dephasing gradient was adjusted so that the peaks of the 32 gradient echoes occurred at the maxima or minima of the sinusoids (i.e., at the times when the rate of phase accumulation was maximal). This resulted in relatively dense sampling at the edges of k-space and relatively coarse sampling close to the center of k-space. FIDs were acquired following each of 128 phase encoding gradients to obtain the second dimension of spatial resolution.

The total runtime for each slice was approximately 6 seconds with a TR of 50 msec which included the signal acquisition time. Gradient strength was adjusted to provide a field-of-view of approximately 40 mm, and in-plane spatial resolution of approximately 350 microns. (Spatial resolution is approximate due to the application of sinusoidally varying gradients.)

Spectroscopic images of human breast (n=4) were also acquired to illustrate the clinical utility of spectroscopic data. Normal volunteers were imaged using a GE 1.5 Tesla SIGNA MR scanner equipped with a dedicated breast coil. Unlike the FSI images discussed above, spectroscopic image (SI) data sets from human breast were composed of 48 separate gradient echo images which were obtained with evolution times ranging from 6 msec to 54 msec in steps of 1 msec. (This is not true fast spectroscopic imaging, but is somewhat faster than the conventional phase encoding method in the case of these high resolution images.) Spatial resolution was approximately 1 mm by 1 mm in a single 3 mm thick slice. A 3D Fourier transform produced a proton spectrum for each image voxel with frequency resolution of approximately 20 Hz and bandwidth of approximately 1000 Hz. To determine the height of the water and fat resonances, the highest point within a selected spectral range was assigned to each resonance. Integrals were determined by integrating across the spectral ranges assigned to the water and fat resonances respectively.

Once the datasets are collected by the controlling processor 18 through the detector 20 from the coil 24, the datasets are transferred to the SASSI processor 16. A number of steps are performed within the processor 18 which separates spatial and spectral information (SASSI) of the collected datasets. The SASSI processor 18 functions to synthesize images from FSI raw data ((of the datasets)). Data in both k-space and spectral space are non-uniformly sampled. Here, we describe a novel method for regridding information using the SASSI processor 18, which separates spatial and spectral information.

Figure 3A:
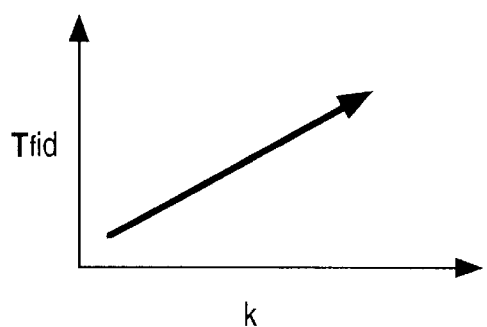
FIGS. 3A–B depict evolution of the proton FID detected using the system of FIG. 1.

Conventional MR images contain artifacts and blurring because spatial information is mixed with spectral information. This phenomenon is illustrated in FIG. 3A where the "trajectory" through k-space during the readout (i.e., signal acquisition period, or a typical MR imaging experiment) is shown.

Figure 3B:
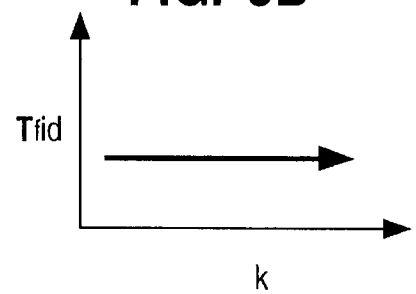

The evolution of the FID due to resonance offset effects (i.e., chemical shift, magnetic susceptibility, and main field in homogeneity) and relaxation is shown along the "TFID" axis (where TFID represents evolution in time of the proton FID). The "k-space" trajectory, which occurs due to the applied readout gradient provides spatial information (shown as the k axis in FIG. 3). The trajectory shown is for a single readout gradient with no phase encoding. The trajectory in FIG. 3A is skewed or slanted because evolution of the proton free induction decay due to resonance offset effects and relaxation occurs while the readout gradient is applied. Ideally the trajectory would be at right angles to the "Y" axis as shown in FIG. 3B; in this trajectory, spatial and spectral effects are orthogonal. A high amplitude gradient would minimize resonance offset effects and produce a trajectory similar to FIG. 3B because the gradient would be applied for a short period of time during which evolution of the FID is negligible. Unfortunately, this would also result in a severe decrease in signal-to-noise ratio because signal would be detected across a very broad bandwidth, i.e., the gradient echo is acquired almost instantaneously.

Fast spectroscopic imaging datasets can be analyzed to account for the evolution of the FID without the need for very large amplitude readout gradients. This is distinct and different from the methods developed by Glover et al. and others, who used multiple point Dixon methods to minimize effects of resonance offset. The more complete datasets which are obtained with FSI methods provide a unique opportunity to identify and minimize effects of resonance offset from all sources (i.e., chemical shift, local variations in magnetic susceptibility, and in homogeneity in the main field). As a result one can obtain images in which the applied gradients are the only magnetic field gradients which significantly affect images.

Figure 4A:
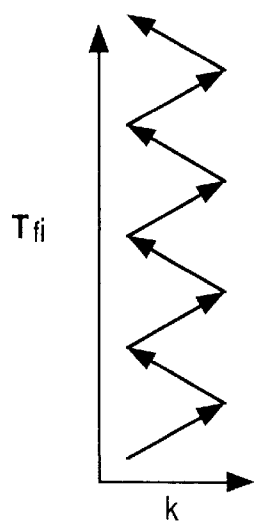
FIGS. 4A–B depict a regridding of the gradient echoes which modulate the FID produced by the system of FIG. 1. The 'K' axis represents the evolution of the gradient echo signal due to the applied gradient which is used to produce the MR image. The 'tfid' axis represents the evolution of the gradient echo signal due to resonance offset effects. The detected gradient echoes, depicted schematically in FIG. 4a are analyzed to approximate a series of gradient echoes which are detected instantaneously, so that each entire gradient echo is detected at a single TFID.
Figure 4B:
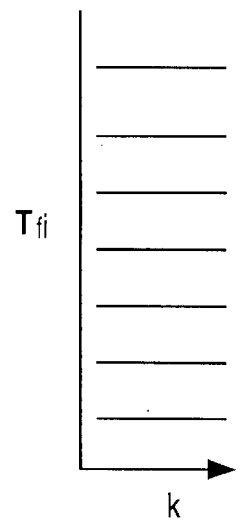

FIG. 4A shows the trajectory through time (TFID "k-space (readout", no phase encoding) of an FSI readout of the type practiced under one embodiment. Following the initial dephasing gradient, a positive readout gradient (the first positive lobe of the readout gradient sinusoid) is applied which moves the trajectory from "−" to "+" k values. The subsequent negative lobe of the gradient pulse moves the trajectory back from "+" to "−". At the same time the evolution of the proton FID due to resonance offset moves the trajectory upward along the "TFID" axis. In FIGS. 4A and 4B, the non-uniform k-space sampling is not shown. The MR signal along each row of k-space in FIG. 4A can be described in general by an equation (Eqn. 1) of the form:

$$S(k, Tfid) = \sum_{x=n0}^{nc} \exp(-i \times k) \times$$

$$\left\{ \sum_{x=m0}^{me} A(x_n, f_m) \exp(-if_m \times Tfid) \times \exp\left(\frac{-Tfid}{T_2^*(x_n, f_n)}\right) \right\}$$

where "k" is the integral of the applied readout gradient. For purposes of illustration, the evolution of the FID and the readout gradient are assumed to begin at the same time. At each position $x_n$ in the sample, there are also assumed to be a number of different populations of water protons (0 through $n_e$) with different characteristic resonance frequencies and decay time constants. A $(x_m, f_m)$ is proportional to the number of water protons at a position $x_n$ with a characteristic resonance frequency $f_m$ and a decay constant $T_2^*(x_m, f_m)$. Image distortion occurs because in each row of k-space there is mixing of terms due to $f_m$ and $x_n$. In an "ideal" MR image, the shape of the object would be obtained from the Fourier transform of terms of the form (Eqn. 2):

$$S(k) = \Sigma_x A(x_n) \exp(-ixk)$$

which are obtained from an "ideal" k-space trajectory like the one shown in FIG. 3B. Note that in equation 2 there are no terms due to the evolution of the proton FID.

Figure 5:
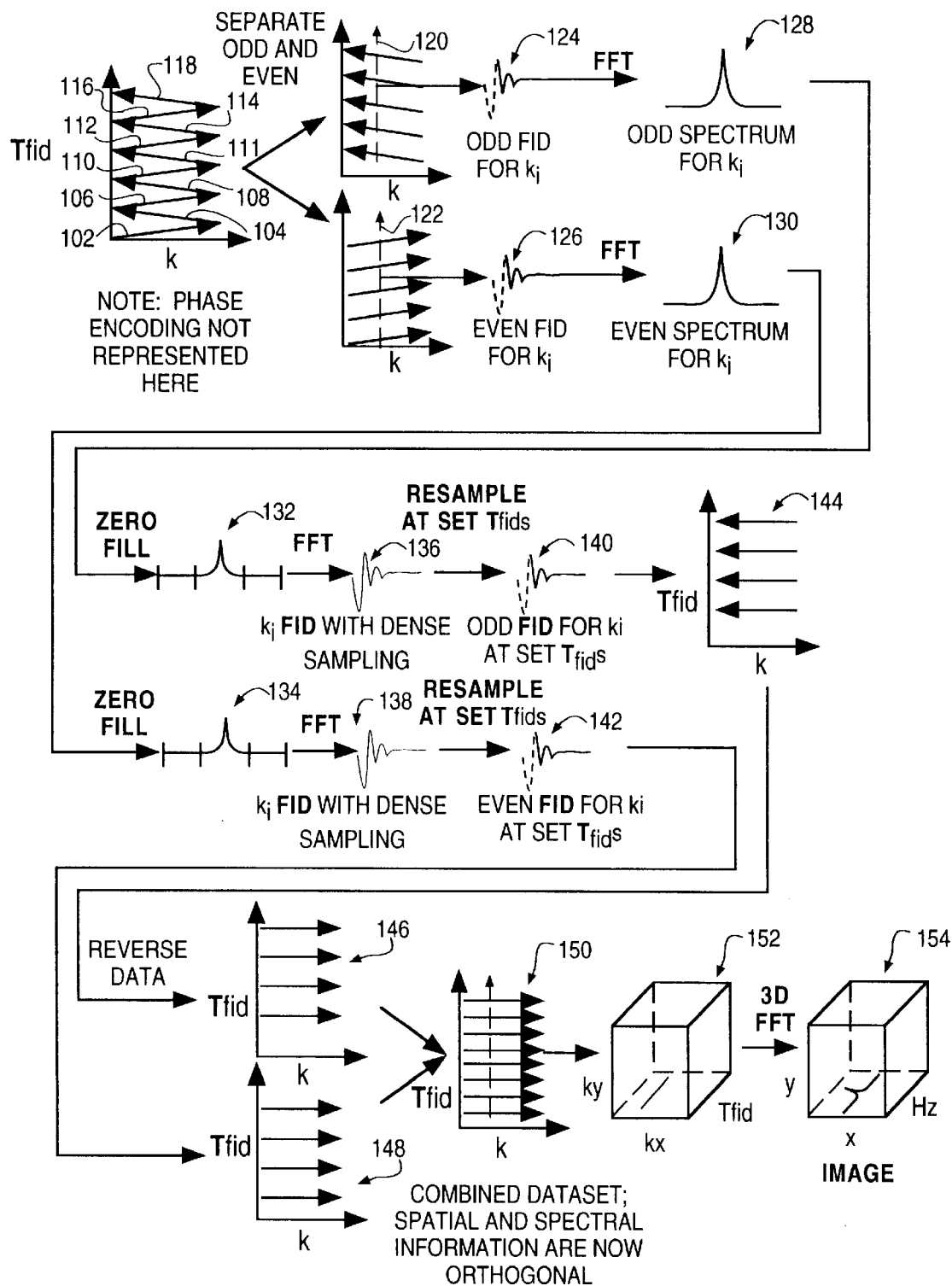
FIG. 5 depicts a flow diagram which describes the method for analysis of FSI data which is produced as per FIG. 1.

Although the ideal case described by Eqn. 3B cannot be achieved in practice, it can be approximated using data obtained using the protocol (flow) diagramed in FIG. 5. FIG. 5 shows in pictorial form a procedure that may be used by the SASSI processor 16 for taking non-uniformly sampled spectral plane information (for a set readout k point) and regridding it so that the spectral FID points that make up the FIDs are uniformly sampled. Not only are they uniformly sampled, but the FIDs for all the readout k space points are uniformly sampled at the same TIME POINT, TFID, along a series of rows which are at right angles to the FID axis so that the influence of the applied gradient is completely separated from the influence of the proton FID evolution. This means that the gradient echoes which are calculated by the SASSI procedure approximate gradient echoes which are collected instantaneously, so that there is no evolution of the proton FID during the gradient echo (as per the gradient echo data shown in FIG. 3B). However, the severe penalty in signal-to-noise ratio which would occur if the duration of the gradient echo were significantly shortened by application of very large imaging gradients is avoided by the SASSI procedure.

To this end, we select sets of the sampled points along a series of lines 120, 122 perpendicular to the k-space axis as shown in FIG. 5. Along these lines, the effect of the applied gradient is constant (to a good approximation—ignoring eddy currents); thus the only thing that affects the phase and amplitude of signal along these lines is resonance offset and relaxation of the proton FID. In fact, these lines 120, 122 of constant "k" trace out a "pseudo FID" in which the phase and amplitude varies as a function of time due to resonance offset and relaxation. The points along each constant k line at which the signal is acquired are the points at which the "constant k line" intersects the "k-space trajectory" as shown in FIG. 5. For convenience we label these time points $t_{sk}$; the subscript "sk" emphasizes that there is a different set of points $t_s$ for each "constant k line". For each "constant k line" at each time point $t_{sk}$ the signal, $S(t_{sk}, k_i)$ is the sum of a number of different Fourier components of the form (Eqn. 3):

$$S(t_{sk}, k_i) = \sum_{f=m0}^{me} \exp(-if_m T_{sk}) \times \left\{ \sum_{x=n}^{ne} A(x_n, f_m) \exp(-i \times k) \left( \frac{-t_s}{T_2^*(x_n, f_n)} \right) \right\}$$

For all points tsk along each "constant k line", the expression in braces is constant because, ignoring eddy currents, the integral of the gradient, "G", is constant. For these points we can rewrite Eqn. 3 as $$S(t_{sk}, k_i) = \sum_{f=m}^{me} C(f_m) \exp(-if_{mt_{sk}})$$

where C is a complex constant associated with each frequency component that reflects the shape and composition of the imaged object, and the spatial distribution of each frequency component. Recall that the set of points $t_{sk}$, at which each pseudo FID is sampled, are different.

The goal of the analysis is to estimate the values of S(k, FID) along a series of rows which are at right angles to the FID axis so that the influence of the applied gradient is completely separated from the influence of the proton FID evolution. This can be accomplished by estimating the values of the pseudo FIDs, $S(t_{sk}, k_i)$, at a series of points $t_{so}$ which are the same for each pseudo FID. To do this, as diagramed in FIG. 5, we Fourier transform the "pseudo FID" (STEP 128), increase its bandwidth by adding zeros to the spectrum (STEP 132), and then perform an inverse Fourier transform to obtain a densely sampled "pseudo-FID" (STEP 136). Then, along each "constant k" line, we select a series of points, $t_{so}$, which are the same along each "constant k" line—all the other points are discarded (STEP 140). We now have a series of rows through k-space which are perpendicular to the $T_{FID}$ axis and intersect the TFID axis at a series of points, $t_{so}$ (STEP 144). To the extent that these new rows through k-space correctly represent the raw data, we now have a data set in which spatial and spectral data are well separated.

The data from odd gradient echoes can now be reversed (step 144/146) and data from odd and even echoes can be recombined (step 150) to double the bandwidth of the data in the spectral domain. Since resonance offset effects have been minimized, there is no significant artifact due to this procedure. Data can now be Fourier transformed along spatial and spectral dimensions (step 154) to produce an image in which spatial and spectral information is well separated.

Following regridding in the spectral plane, data must be regridded in k-space (not shown in FIG. 5), because of the sinusoidally varying readout gradient. This varying readout gradient means that acquired k-space data is more densely sampled in the edges compared to the center of k-space (for a single set of readout data, for one phase encode step). An accurate means of regridding, in this case, a non-uniform interpolation function called SASSI (e.g., IDL, from Research Systems, Boulder, Colo.) is used to create a uniform set of data.

Figure 6:
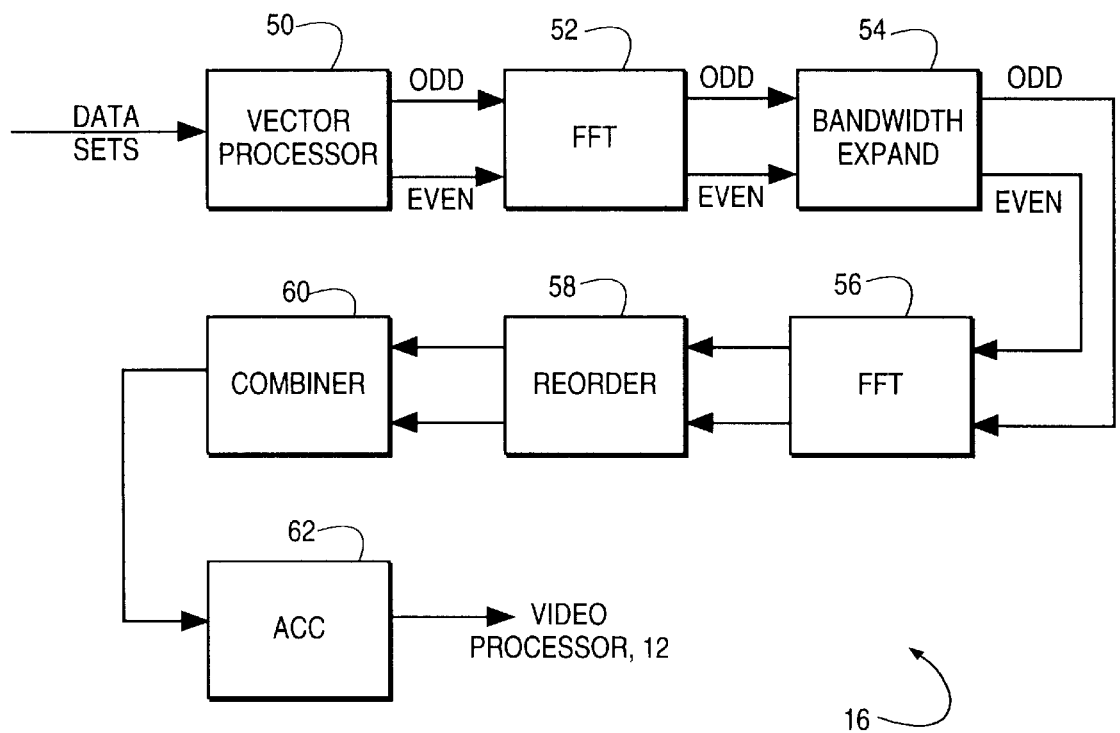
FIG. 6 is a more detailed block diagram of a portion of the system of FIG. 1.
Figure 7A:
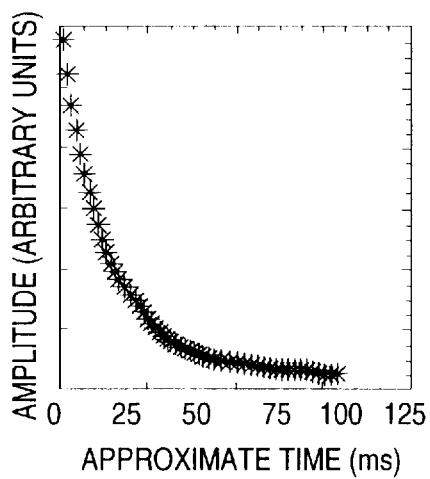
FIGS. 7A–D depict effects of eddy currents on the FIDS detected by the system of FIG. 1.
Figure 7B:
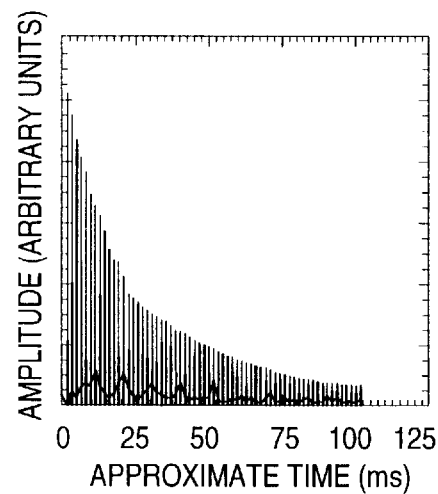
Figure 7C:
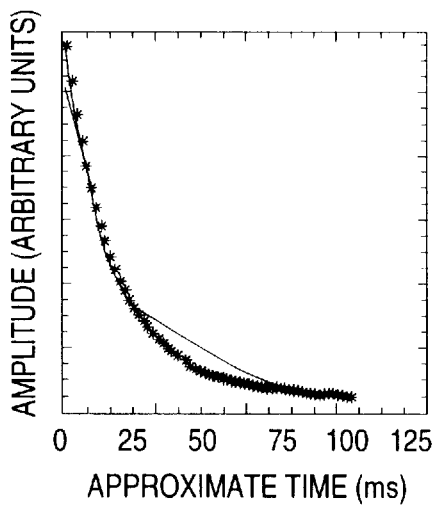
Figure 7D:
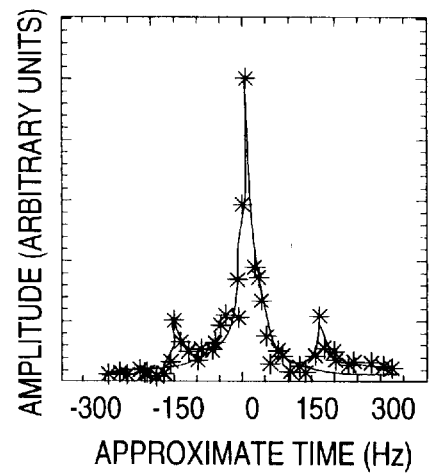
Figure 8A:
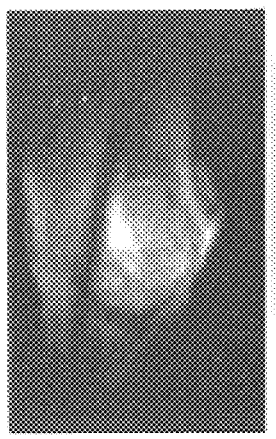
FIGS. 8A–8D depict further image results of a rodent using the system of FIG. 1.
Figure 8B:
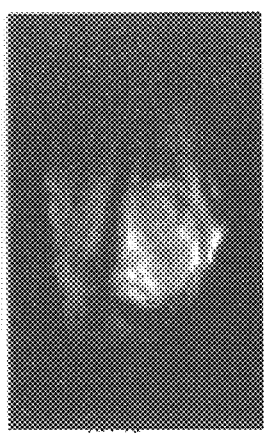
Figure 8C:
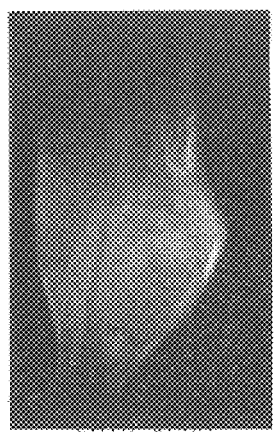
Figure 8D:
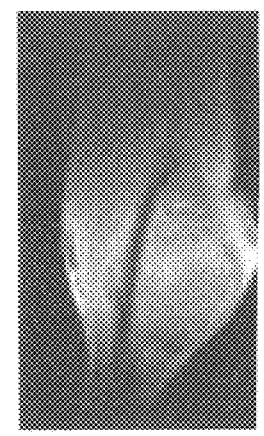

FIG. 6 is a block diagram of structure of the SASSI processor 16 for performing the processing steps of the flow of FIG. 5. As shown, a dataset 102–118 of the gradient echoes is collected for each half cycle of the sinusoidal readout gradient ('X') shown in FIG. 2. Within the vector processor 50, the data sets representing the odd and even echoes are divided temporally into ordered odd and even datasets.

For the set of odd echoes and the set of even echoes (separately) the series of sampled points $t_{sk}$ where each constant k line 120, 122 intersects the k-space trajectory is selected within the vector processor 50. The points are shown in the time domain in FIG. 5 and have the appearance of a damped oscillation 124, 126. These points can be thought of as a pseudo-FID, because, like a conventional FID, the signal evolves according to resonance offset and relaxation effects.

The "pseudo-FID" 124, 126 may be Fourier transformed with a FFT processor 52. The Fourier transformed pseudo-FID 124, 126 may then be baseline corrected.

The bandwidth of the Fourier transform is artificially increased by a factor of 4 or more by adding zeros at both edges of the spectrum within the bandwidth processor 54. Some smoothing may be applied by the bandwidth processor 54.

An inverse FFT within the FFT processor 56 produces a pseudo-FID 136, 138 with many more points than were present in the raw data. If there are no signals present at higher frequencies than what the sampling rate of the pseudo-FID can account for (i.e., at frequencies greater than one half of the inverse of the time between gradient echoes), then this interpolation can be considered accurate.

The value of each pseudo-FID is determined at a series of points $t_{so}$, which are the same for each pseudo-FID, i.e., for each value of k. This is done for data obtained from both odd and even echoes.

As a result, for both odd and even echoes, we have new values of $S(t_{so}, k_i)$ 140, 142 which are disposed along rows for which TFID is constant and only k varies—as shown in FIG. 5. This means that to a good approximation, spatial information is no longer contaminated with spectral information.

The data for odd echoes 144 are reversed 146 within the reorder processor 58 so that both the odd and even echo data 146, 148 follow the same k-space trajectory.

Data for odd and even echoes are recombined 150 within the combiner processor 60; this effectively doubles the bandwidth of the spectroscopic data. Interpolation may also be used to obtain a data set with a uniform k-space sampling (not shown in FIG. 5) along the readout direction.

Following the recombination of the datasets 146, 148, the combined dataset 150 may be written into a three-dimensional memory 32. The SASSI procedure shown in the diagram must be applied to data obtained for each phase encoding step so that data sets with two or three spatial dimension and one spectral dimension are obtained. Using the three-dimensional memory 32, data regarding MR detectable nuclei may be accumulated in three-dimensional space over many readings. Using data from a number of readings allows data for a particular point in space to be accumulated in a more reliable manner. Further, pixels formed from the data may be assigned intensity values which are proportional to peak height, line width, resonance frequency, integral, or other features of the various resonances which are detected.

A three-dimensional Fourier transform may be performed to obtain an image with two spatial dimensions and one frequency dimension. This synthesized image has been shown to be relatively free of resonance offset effects.

The accuracy of the above process is based upon the assumption that sampling of the pseudo-FIDs at the set of points substantially defines the signal (i.e., no Fourier components are present at a frequency higher than that which is adequately sampled by the pseudo-FIDs). In addition, it is assumed that the process by which the pseudo-FID decays is constant and well represented by the sampled points. Data developed under the above process, however, demonstrates that this procedure substantially improves image quality.

$T_1$-weighted images may be produced from FSI datasets by calculating the integral of the water and fat resonances in each image voxel. $T_s^*$-weighted images may also be produced by calculating the line width of the water and fat resonances in each image voxel. In addition, images in which intensity is proportional to the peak heights of the water and fat resonances may be produced. Many other types of contrast could, in principle, be obtained from FSI datasets.

The prior art has shown that the effects of eddy currents on FSI data sets are relatively small. Therefore, the assumption of the analysis described above, that eddy currents could be ignored, is justified and SASSI can be applied to FSI data.

FIG. 7 illustrates the effects of eddy currents due to the sinusoidally oscillating gradients which were used to produce fast spectroscopic images in the 4.7 T magnet. Free induction decays were detected from a 1 cm diameter spherical water phantom placed 1 cm from the magnet isocenter. In FIG. 7A there were no applied gradients during the free induction decay. In FIG. 7B, a gradient was turned on during acquisition (the magnitude of the detected signal is shown). The amplitude of the gradient varied sinusoidally with 32 cycles and a maximum amplitude of 2 gauss/cm. FIG. 7C shows the free induction decay formed from the peaks of the gradient echoes produced by the oscillating gradient (the asterisks in FIG. 7C indicate the points at which the integral of the gradient waveform was expected to be zero) and the corresponding points form the FID obtained in the absence of oscillating gradients (solid line). Some effects of the readout gradient are evident, particularly later in the FID, which might be reduced with improved eddy current compensation. However, even with standard eddy current compensation, the difference between the two lines in FIG. 7C is relatively small. This is further illustrated in FIG. 7D, which shows the spectra produced by Fourier transform of the FIDs (asterisks represent data obtained with gradients on, the solid line represents data obtained with gradients off). The spectra are very similar and there is no broadening due to eddy currents evident at this low spectral resolution (FIG. 7D). The small "satellites" of the water peak which are observed when FIDs are acquired in the presence of oscillating gradient are reduced when the number of data points are increased by interpolation. This suggests that they are primarily due to errors in the location of the points at which the gradient waveform integrates to zero.

FIG. 8 shows images of a single slice through a tumor bearing hind limb of a rodent in which intensity is proportional to the integral (FIG. 8A) and peak height (FIG. 8B) of the water resonance in each voxel. These synthesized images have in-plane spatial resolution of approximately 350 microns in a 2 mm slice. The spectral resolution of the original spectroscopic data is approximately 20 HZ. For purposes of comparison, FIG. 8C shows a spin echo image (TE=50 msec) of the same slice with similar resolution, and FIG. 8D shows a gradient echo image with a TR of 50 msec. (Comparisons of the signal-to-noise ratios of the various images under the present experimental conditions would be misleading, since the peak height and peak integral images were synthesized from the 32 gradient echoes which modulated the proton FID, while the spin echo image was acquired with only one refocusing pulse.) In the peak height IMAGE (FIG. 8B) obtained from FSI data, the tumor appears very bright as would be expected in $T_2$-weighted images, but the contrast in tumor relative to surrounding muscle is more pronounced than in the spin echo images. The tumor boundaries are similar but not identical in the peak height (FIG. 8B) and spin echo images (FIG. 8C) and intensity in the tumor is more heterogeneous in the peak height image that in the spin echo image. The margins of the tumors appear to be more clearly defined in FSI datasets (i.e., see arrow in FIG. 8B).

Figure 9C:
FIGS. 9A–C depict spectroscopic images of a human breast using the system of FIG. 1.
Figure 9B:
Figure 9A:

FIG. 9 shows spectroscopic images of the breast of a normal human volunteer. In FIG. 9A intensity is proportional to water signal peak height and in FIG. 9B intensity is proportional to fat signal peak height. For purposes of comparison. FIG. 9C shows a gradient echo image of the same slice. The gradient echo image was obtained with 8 averages, compared with 1 acquisition for each of the 48 gradient echoes which were used to form the peak height images. Many of the details which are evident in the peak height images derived from SI data are not seen in the gradient echo image.

The peak height images in FIG. 8 show high intensity in the tumor and are qualitatively similar to $T_2$-weighted images. Peak height is proportional to $AxT_2^*$ (assuming a Lorentzian line shape) where "A" is the maximum amplitude of the FID. Since the data were acquired with short TR (50 ms) "A" depends on $T_1$ and thus peak height images should be both T1 (because data were acquired under saturating conditions) and $T_2^*$-weighted. However, at high field levels (4.7 Tesla), $T_1$ contrast is weak so that "A" is relatively constant across the image. As a result, the dominant contrast in peak height images is a function of $T_2^*$. Unlike $T_2^*$ contrast in conventional gradient echo images, $T_2^*$ contrast can be obtained from FSI data sets with reduced effects from destructive interference between the various Fourier components. Peak height images may be a practical way to obtain $T_2^*$ contrast because, although they do not provide pure $T_2^*$ contrast, the signal-to-noise ratio is high (e.g., relative to images in which intensity is proportional to water signal line width). The data from rodent tumors suggests that peak height images contain significantly more heterogeneity than comparable $T_2$-weighted images and that tumor margins are more clearly defined by FSI. The source of heterogeneity must be determined from detailed comparison of MR and histology. However, it is reasonable to suggest that FSI data sets provide information which is not present in conventional MR images.

It is possible that the $T_2^*$ contrast provided by SI or FSI data sets may approximate $T_2$ contrast. In spin echoes, effects of chemical shift and magnetic susceptibility gradients are refocused while with FSI they are resolved so that the $T_2^*$s of individual resonances can be measured. To the extent that high resolution spectroscopic data resolve individual homogeneously broadened resonances, $T_2^*$ can approach $T_2$. Because of the heterogeneity of living tissue, it is unlikely that the limit $T_2^*=T_2$ can be reached except in edematous areas. However, in practice, $T_2$ contrast provided by FSI images may sometimes be a useful substitute for $T_2$ contrast. The "$T_2$-like" contrast which is evident in FIGS. 8B, 9A and 9B was obtained under conditions (short TR and low pulse angle) which maximize signal-to-noise ration and avoid artifacts due to imperfect RF-refocusing. In addition, T2* contrast has advantages because many of the effects which are suppressed by refocusion in T2 weighted images are retained and contribute to contrast in T2* weighted images (see discussion above).

Other types of useful contrast can be obtained from FSI. If pure $T_2^*$ contrast is desired (as opposed to the peak height contrast discussed above), this can be obtained from the line width of the resonances in each voxel. $T_1$-weighted images can be synthesized from the integral of the water or fat resonance. In addition to the peak values of the water and fat resonance, FSI has the potential to provide additional contrast which derives from the detailed shapes and resonance frequencies of the water and fat resonances. The various resolvable components of the resonances can be examined in detail. Previous spectroscopic imaging studies of rodent tumors demonstrate that there is significant heterogeneity in water and fat resonance of tumors, and that changes in the "fine structure" of these resonances under various conditions contain valuable information. This information may have diagnostic utility. Fast spectroscopic imaging may also be useful for measurements of the kinetics of contrast agent uptake because it allows separation of T1 and $T_2^*$ effects and may improve image quality by reducing effects of susceptibility gradients caused by the contrast agent. A simplified version of this approach, based on the acquisition of two gradient echoes following each excitation (to produce two point "spectroscopic images") was recently demonstrated by the inventors.

Imaging of the breast may be an important application of SI/FSI methods. FSI is a significant improvement over the multiple point Dixon methods, i.e., spectroscopic images with low frequency resolution, which have significantly improved the quality of breast images. However, the images with lower frequency resolution may not accurately account for the significant heterogeneity of the water and fat resonances and do not offer the signal-to-noise ratio advantages of SI images obtained by sampling an optimal portion of the FID. The high spatial and frequency resolution of FSI data may result in improved images. In general, spectroscopic information can be used to reduce artifacts and image blurring caused by resonance offset effects as per the 'SASSI' method described above. This has been demonstrated using multiple point Dixon methods, but correction of resonance offset can be more effective with FSI data sets. In the case of the current experiments, the spectral resolution of FSI data sets was only 20 Hz. Higher resolution should be achievable and may be desirable for accurate measurements of the line shapes of the water and fat resonances and correction for resonance offset effects.

FSI can be considered an extension of the widely used "bandwidth matching" method which optimizes signal-to-noise ratio by making optimal use of transverse magnetization. When a single homogeneously broadened water signal is detected, bandwidth matching is the appropriate method for optimizing image quality. A single low amplitude readout gradient is applied until the signal decays significantly, i.e., on the order of $T_2$ seconds; this is equivalent to an FSI experiment with 1 point spectral resolution. However, if there is significant inhomogeneous broadening (i.e., $T_2^* << T_2$), the time during which useful signals are detected can be extended using FSI. Loss of signal due to phase interference is reduced because a number of different Fourier components (equal to the spectral resolution) are distinguished. In general, the choice of the spectral bandwidth and resolution for the FSI experiment is subjective. A high spectral bandwidth requires many sinusoidal oscillations per second and this will degrade signal-to-noise ration because the bandwidth of the detected signal is increased. On the other hand, spectral bandwidth which is too low will result in the loss of useful signal because different Fourier components may "fold back" onto each other causing destructive interference.

Using FSI, images of single slices can be obtained with high spatial and frequency resolution in 5–30 seconds. Thus 8 to 16 slices can be obtained with reasonable time resolution. To increase time resolution larger volumes of tissue can be imaged by applying larger gradients at the expense of reduced signal-to-noise ratio.

The present results suggest that FSI produces images which might be clinically useful and contain contrast which is not available in conventional images. FSI is a highly efficient use of transverse magnetization which extracts increased information. The need to sample the entire FID increases the run time of FSI images and therefore increases vulnerability to motion artifacts. However, other characteristics of FSI data yield decreased run times. It may be possible to obtain "$T_2$-like" contrast from measurements of water signal peak height or line width with low tip angles and short TRs. The need for RF refocusing pulses is avoided. In addition, $T_2^*$ contrast may be more pronounced than $T_2$ contrast because effects which are refocussed and therefore suppressed in $T_2$-weighted images are retained in $T_2^*$ weighted images. FSI data sets can be analyzed to produce both $T_1$ and $T_2$ contrast, as well as a variety of other types of contrast based on line shape and resonance frequency. Thus it may be possible to obtain enough information for diagnostic purposes with a single scan, rather than the multiple scans which are commonly used in clinical MR exams. At present, it is not known which MR examinations would benefit most from FSI methods; comprehensive imaging studies of a variety of organs and tissues will be required to obtain this information.

High performance gradients and other hardware improvements have been used primarily to increase the speed with which large volumes of tissue can be imaged. An alternative to this strategy is to acquire significantly increased information concerning a region of interest. One way to do this is to use the FSI methods discussed here. FSI methods are straightforward and can easily be incorporated into a variety of clinical imaging protocols.

FSI as used herein can be used to maximize signal-to-noise ratio per unit time because it allows detection of an optimal position of the proton FID. Contrast which is similar to $T_2$ contrast can be obtained with a short repetition time and without the need for spin echoes. Spectroscopic data can be used to reduce artifacts and image distortion due to magnetic susceptibility gradients. Compared to conventional MRI, FSI datasets provide an additional dimension (i.e., the details of the water and fat signal line shapes). The results demonstrate that incorporation of the above FSI methods into many standard clinical MRI procedures may significantly improve image quality.

Specific embodiments of methods and apparatus of providing fast spectroscopic images according to the present invention have been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A method of generating a magnetic resonance image of a biotic structure comprising the steps of:

generating a plurality of datasets by modulating a free induction decay of at least some MR detectable nuclei in the biotic structure with a sinusoidally oscillating magnetic field gradient;

using the spectroscopic and spatial information present in the acquired signal to approximate a set of instantaneously acquired gradient echoes; and synthesizing images based upon the approximated acquired gradient echoes.

2. The method of generating a magnetic resonance image as in claim 1 further comprising bringing the at least some MR detectable nuclei into magnetic resonance.

3. The method of generating a magnetic resonance image as in claim 1 wherein the step of generating a plurality of datasets by modulating a free induction decay from at least some MR detectable nuclei in the biotic structure with a sinusoidally oscillating magnetic field gradient further comprises dividing the plurality of datasets into odd and even datasets.

4. The method of generating a magnetic resonance image as in claim 1 wherein the step of using the spectroscopic and spatial information present in the acquired signal to approximate a set of instantaneously acquired gradient echoes further comprises identifying a temporal sequence of data points along a substantially constant k-line in k-space along a constant integral of the applied gradient within the odd and within the even datasets.

5. The method of generating a magnetic resonance image as in claim 4 wherein the step of using the spectroscopic and spatial information present in the acquired signal to approximate a set of instantaneously acquired gradient echoes further comprises creating an expanded spectra for the odd and even sequence of data points by Fourier transforming along each constant k-line and adding zeros at either end of each transformed temporal sequence to adjust its bandwidth.

6. The method of generating a magnetic resonance image as in claim 5 wherein the step of using the spectroscopic and spatial information present in the acquired signal to approximate a set of instantaneously acquired gradient echoes further comprises generating an odd and even densely sampled spectra by inverse Fourier transforming the zero adjusted spectra.

7. The method of generating a magnetic resonance image as in claim 6 wherein the step of using the spectroscopic and spatial information present in the acquired signal to approximate a set of instantaneously acquired gradient echoes further comprises approximating a set of pseudo gradient echoes and corresponding echo datasets for each pseudo gradient echo from the densely sampled pseudo-FIDs, each echo dataset having an phase and amplitude equivalent to sampling a corresponding water proton of the at least some water protons at a single point in an evolution of the proton free induction decay.

8. The method of generating a magnetic resonance image as in claim 7 wherein the step of using the spectroscopic and spatial information present in the acquired signal to approximate a set of instantaneously acquired gradient echoes further comprises reversing the frequency-space trajectories of the echo datasets of the separated odd datasets so that they evolve in the same direction as the echo dataset of the separated even datasets.

9. The method of generating a magnetic resonance image as in claim 8 wherein the step of using the spectroscopic and spatial information present in the acquired signal to approximate a set of instantaneously acquired gradient echoes further comprises interleaving the reversed odd echo datasets with the even echo datasets.

10. The method of generating a magnetic resonance image as in claim 9 wherein the step of using the spectroscopic and spatial information present in the acquired signal to approximate a set of instantaneously acquired gradient echoes further comprises fast Fourier transforming the interleaved reversed odd echo datasets and even echo datasets along a set of spatial and spectral directions of the at least some protons.

11. The method of generating a magnetic resonance image as in claim 10 wherein the step of using the spectroscopic and spatial information present in the acquired signal to approximate a set of instantaneously acquired gradient echoes further comprises analyzing the spectral information which pertains to each image voxel to synthesize images in which intensity is proportional to the $T_2^*$, the peak height, the peak integral, the peak resonance frequency, and other parameters derived from the lineshape of each resolvable spectral component.

12. Apparatus for generating a magnetic resonance image of a biotic structure comprising:

means for generating a plurality of datasets by modulating a free induction decay of at least some MR detectable nuclei in the biotic structure with a sinusoidally oscillating magnetic field gradient;

means for using the spectroscopic and spatial information present in the acquired signal to approximate a set of instantaneously acquired gradient echoes; and means for synthesizing images based upon the approximated acquired gradient echoes.

13. The apparatus for generating a magnetic resonance image as in claim 12 further comprising means for bringing the at least some MR detectable nuclei into magnetic resonance.

14. The apparatus for generating a magnetic resonance image as in claim 12 wherein the means for generating a plurality of datasets by modulating a free induction decay of at least some MR detectable nuclei in the biotic structure with a sinusoidally oscillating magnetic field gradient further comprises means for dividing the plurality of datasets into odd and even datasets.

15. The apparatus for generating a magnetic resonance image as in claim 12 wherein the means for using the spectroscopic and spatial information present in the acquired signal to approximate a set of instantaneously acquired gradient echoes further comprises means for identifying a temporal sequence of data points along a substantially constant k-line in k-space along a constant integral of the applied gradient within the odd and within the even datasets.

16. The apparatus for generating a magnetic resonance image as in claim 15 wherein the means for using the spectroscopic and spatial information present in the acquired signal to approximate a set of instantaneously acquired gradient echoes further comprises means for creating an expanded spectrum for the odd and even sequence of data points by Fourier transforming along each constant k-line and adding zeros at either end of each transformed temporal sequence to substantially increase its bandwidth.

17. The apparatus for generating a magnetic resonance image as in claim 16 wherein the means for using the spectroscopic and spatial information present in the acquired signal to approximate a set of instantaneously acquired gradient echoes further comprises means for generating an odd and even densely sampled spectra by inverse Fourier transforming the baseline corrected spectra.

18. The apparatus for generating a magnetic resonance image as in claim 6 wherein the means for using the spectroscopic and spatial information present in the acquired signal to approximate a set of instantaneously acquired gradient echoes further comprises means for approximating a set of gradient echoes and corresponding echo datasets for each gradient echo from the densely sampled pseudo-FIDs, each echo dataset having an phase and amplitude equivalent to sampling a corresponding water proton of the at least some water protons at a single point in an evolution of the proton free induction decay.

19. The apparatus for generating a magnetic resonance image as in claim 18 wherein the means for using the spectroscopic and spatial information present in the acquired signal to approximate a set of instantaneously acquired gradient echoes further comprises means for reversing the frequency-space trajectories of the echo datasets of the separated odd datasets so that they evolve in the same direction as the echo dataset of the separated even datasets.

20. The apparatus for generating a magnetic resonance image as in claim 19 wherein the means for using the spectroscopic and spatial information present in the acquired signal to approximate a set of instantaneously acquired gradient echoes further comprises means for interleaving the reversed odd echo datasets with the even echo datasets.

21. The apparatus for generating a magnetic resonance image as in claim 20 wherein the means for using the spectroscopic and spatial information present in the acquired signal to approximate a set of instantaneously acquired gradient echoes further comprises means for fast Fourier transforming the interleaved reversed odd echo datasets and even echo datasets along a set of spatial and spectral directions of the at least some protons.

22. The apparatus for generating a magnetic resonance image as in claim 20 wherein the means for using the spectroscopic and spatial information present in the acquired signal to approximate a set of instantaneously acquired gradient echoes further comprises analyzing the spectral information which pertains to each image voxel to synthesize images in which intensity is proportional to the $T_2^*$, the peak height, the peak integral, the peak resonance frequency, and other parameters derived from the lineshape of each resolvable spectral component.

23. Apparatus for generating a magnetic resonance image of a biotic structure comprising:
   a gradient coil which generates a plurality of datasets by modulating a free induction decay of at least some MR detectable nuclei in the biotic structure with a sinusoidally oscillating magnetic field gradient;
   an approximation processor which uses the spectroscopic and spatial information present in the acquired signal to approximate a set of instantaneously acquired gradient echoes; and
   a synthesizing processor which synthesizes images based upon the approximated acquired gradient echoes.

24. The apparatus for generating a magnetic resonance image as in claim 23 further comprising a radio frequency transmitting coil which brings the at least some MR detectable nuclei into magnetic resonance.

25. The apparatus for generating a magnetic resonance image as in claim 23 wherein the gradient coil which generates a plurality of datasets by modulating a free induction decay of at least some MR detectable nuclei in the biotic structure with a sinusoidally oscillating magnetic field gradient further comprises a vector processor which divides the plurality of datasets into odd and even datasets.

26. The apparatus for generating a magnetic resonance image as in claim 23 wherein the approximation processor which uses the spectroscopic and spatial information present in the acquired signal to approximate a set of instantaneously acquired gradient echoes further comprises a correlation processor which identifies a temporal sequence of data points along a substantially constant k-line in k-space along a constant integral of the applied gradient within the odd and within the even datasets.

27. The apparatus for generating a magnetic resonance image as in claim 26 wherein the approximation processor which uses the spectroscopic and spatial information present in the acquired signal to approximate a set of instantaneously acquired gradient echoes further comprises a bandwidth processor which creates an expanded spectra for the odd and even sequence of data points by Fourier transforming along each constant k-line and adding zeros at either end of each transformed temporal sequence to adjust its bandwidth.

28. The apparatus for generating a magnetic resonance image as in claim 27 wherein the approximation processor which uses the spectroscopic and spatial information present in the acquired signal to approximate a set of instantaneously acquired gradient echoes further comprises a first Fourier processor which generating an odd and even densely sampled spectra by inverse Fourier transforming the zero adjusted spectra.

29. The apparatus for generating a magnetic resonance image as in claim 28 wherein the approximation processor which uses the spectroscopic and spatial information present in the acquired signal to approximate a set of instantaneously acquired gradient echoes further comprises a reordering processor which reverses the frequency-space trajectories of the echo datasets of the separated odd datasets so that they evolve in the same direction as the echo dataset of the separated even datasets.

30. The apparatus for generating a magnetic resonance image as in claim 29 wherein the approximation processor which uses the spectroscopic and spatial information present in the acquired signal to approximate a set of instantaneously acquired gradient echoes further comprises interleaving processor which interleaves the reversed odd echo datasets with the even echo datasets.

31. The apparatus for generating a magnetic resonance image as in claim 30 wherein the approximation processor which uses the spectroscopic and spatial information present in the acquired signal to approximate a set of instantaneously acquired gradient echoes further comprises a second Fourier processor which fast Fourier transforms the interleaved reversed odd echo datasets and even echo datasets along a set of spatial and spectral directions of the at least some protons.

32. A method of generating a magnetic resonance image of a biotic structure from a plurality of data sets in which each data set contains both spatial and spectral information and where any effects of resonant offset are separated from spatial information, such method comprising the steps of:
   exciting a signal from at least some water and fat protons of the biotic structure into magnetic resonance;
   generating a series of gradient echoes by modulating a free induction decay of the at least some water and fat protons of the biotic structure with a sinusoidally oscillating gradient;
   collecting a dataset of emissions of each gradient echo of the series of gradient echoes detected from the free induction decay of the proton for each oscillation of the sinusoidally oscillating gradient;
   separating the datasets into odd and even datasets;
   identifying a temporal sequence of data points along a substantially constant k-line in k-space along a constant integral of the applied gradient within the odd and within the even datasets;
   creating an expanded spectra for the odd and even sequence of data points by Fourier transforming along each constant k-line and adding zeros at either end of each transformed temporal sequence to adjust its bandwidth;

generating an odd and even densely sampled spectra by inverse Fourier transforming the zero adjusted spectra;

approximating a set of pseudo gradient echoes and corresponding echo datasets for each pseudo gradient echo from the densely sampled pseudo-FIDs, each echo dataset having an phase and amplitude equivalent to sampling a corresponding water proton of the at least some water protons at a single point in an evolution of the proton free induction decay;

reversing the frequency-space trajectories of the echo datasets of the separated odd datasets so that they evolve in the same direction as the echo dataset of the separated even datasets;

interleaving the reversed odd echo datasets with the even echo datasets;

fast Fourier transforming the interleaved reversed odd echo datasets and even echo datasets along a set of spatial and spectral directions of the at least some protons; and analyzing the transformed interleaved datasets to synthesize images in which intensity is proportional to peak height, line width, resonance frequency, and integral of the resonances detected.

* * * * *